(12) United States Patent
Palmateer et al.

(10) Patent No.: US 8,735,225 B2
(45) Date of Patent: May 27, 2014

(54) METHOD AND SYSTEM FOR PACKAGING MEMS DEVICES WITH GLASS SEAL

(75) Inventors: Lauren Palmateer, San Francisco, CA (US); William J. Cummings, San Francisco, CA (US); Brian Gally, San Rafael, CA (US); Clarence Chui, San Mateo, CA (US); Manish Kothari, Cupertino, CA (US)

(73) Assignee: Qualcomm Mems Technologies, Inc., San Diego, CA (US)

( * ) Notice: Subject to any disclaimer, the term of this patent is extended or adjusted under 35 U.S.C. 154(b) by 29 days.

(21) Appl. No.: 12/415,986

(22) Filed: Mar. 31, 2009

(65) Prior Publication Data

US 2009/0189230 A1 Jul. 30, 2009

Related U.S. Application Data

(63) Continuation of application No. 11/102,554, filed on Apr. 8, 2005, now abandoned.

(60) Provisional application No. 60/613,476, filed on Sep. 27, 2004.

(51) Int. Cl.
*H01L 23/31* (2006.01)

(52) U.S. Cl.
USPC .................. 438/127; 257/414; 257/E21.502; 257/E23.125; 257/E29.324; 257/415; 438/30; 438/51; 359/245; 359/290; 359/292

(58) Field of Classification Search
USPC ........................................... 257/415; 438/127
See application file for complete search history.

(56) References Cited

U.S. PATENT DOCUMENTS

| | | | |
|---|---|---|---|
| 2,534,846 | A | 12/1950 | Ambrose et al. |
| 3,439,973 | A | 4/1969 | Bernt et al. |
| 3,443,854 | A | 5/1969 | Herbert |
| 3,653,741 | A | 4/1972 | Alvin |
| 3,656,836 | A | 4/1972 | Baudoin et al. |
| 3,704,806 | A | 12/1972 | Plachenov et al. |
| 3,813,265 | A | 5/1974 | Marks |

(Continued)

FOREIGN PATENT DOCUMENTS

| | | |
|---|---|---|
| EP | 0667548 A1 | 8/1995 |
| EP | 1 093 162 | 4/2001 |

(Continued)

OTHER PUBLICATIONS

Office Action dated Sep. 18, 2009, in Chinese App. No. 200510105032.9.

(Continued)

*Primary Examiner* — Minh-Loan T Tran
*Assistant Examiner* — Fazli Erdem
(74) *Attorney, Agent, or Firm* — Knobbe, Martens, Olson & Bear LLP

(57) ABSTRACT

Methods and systems for packaging MEMS devices such as interferometric modulator arrays are disclosed. One embodiment of a MEMS device package structure includes a seal with a chemically reactant getter. Another embodiment of a MEMS device package comprises a primary seal with a getter, and a secondary seal proximate an outer periphery of the primary seal. Yet another embodiment of a MEMS device package comprises a getter positioned inside the MEMS device package and proximate an inner periphery of the package seal.

28 Claims, 6 Drawing Sheets

(56) References Cited

U.S. PATENT DOCUMENTS

| | | | |
|---|---|---|---|
| 3,900,440 A | 8/1975 | Ohara et al. | |
| 3,955,880 A | 5/1976 | Lierke | |
| 4,036,360 A | 7/1977 | Deffeyes | |
| 4,074,480 A | 2/1978 | Burton | |
| 4,099,854 A | 7/1978 | Decker et al. | |
| 4,228,437 A | 10/1980 | Shelton | |
| 4,310,220 A | 1/1982 | Kuwagaki et al. | |
| 4,377,324 A | 3/1983 | Durand et al. | |
| 4,389,096 A | 6/1983 | Hori et al. | |
| 4,400,870 A * | 8/1983 | Islam | 29/832 |
| 4,403,248 A | 9/1983 | Te Velde | |
| 4,431,691 A | 2/1984 | Greenlee | |
| 4,441,791 A | 4/1984 | Hornbeck | |
| 4,445,050 A | 4/1984 | Marks | |
| 4,459,182 A | 7/1984 | Te Velde | |
| 4,482,213 A | 11/1984 | Piliavin et al. | |
| 4,500,171 A | 2/1985 | Penz et al. | |
| 4,519,676 A | 5/1985 | Te Velde | |
| 4,531,126 A | 7/1985 | Sadones | |
| 4,552,806 A | 11/1985 | Hayashi et al. | |
| 4,566,935 A | 1/1986 | Hornbeck | |
| 4,571,603 A | 2/1986 | Hornbeck et al. | |
| 4,596,992 A | 6/1986 | Hornbeck | |
| 4,615,595 A | 10/1986 | Hornbeck | |
| 4,662,746 A | 5/1987 | Hornbeck | |
| 4,663,083 A | 5/1987 | Marks | |
| 4,681,403 A | 7/1987 | Te Velde et al. | |
| 4,710,732 A | 12/1987 | Hornbeck | |
| 4,748,366 A | 5/1988 | Taylor | |
| 4,786,128 A | 11/1988 | Birnbach | |
| 4,790,635 A | 12/1988 | Apsley | |
| 4,856,863 A | 8/1989 | Sampsell et al. | |
| 4,950,344 A | 8/1990 | Glover et al. | |
| 4,954,789 A | 9/1990 | Sampsell | |
| 4,956,619 A | 9/1990 | Hornbeck | |
| 4,977,009 A | 12/1990 | Anderson et al. | |
| 4,982,184 A | 1/1991 | Kirkwood | |
| 5,018,256 A | 5/1991 | Hornbeck | |
| 5,022,745 A | 6/1991 | Zayhowski et al. | |
| 5,028,939 A | 7/1991 | Hornbeck et al. | |
| 5,037,173 A | 8/1991 | Sampsell et al. | |
| 5,044,736 A | 9/1991 | Jaskie et al. | |
| 5,061,049 A | 10/1991 | Hornbeck | |
| 5,075,796 A | 12/1991 | Schildkraut et al. | |
| 5,078,479 A | 1/1992 | Vuilleumier | |
| 5,079,544 A | 1/1992 | DeMond et al. | |
| 5,083,857 A | 1/1992 | Hornbeck | |
| 5,091,983 A | 2/1992 | Lukosz | |
| 5,095,375 A | 3/1992 | Bolt | |
| 5,096,279 A | 3/1992 | Hornbeck et al. | |
| 5,099,353 A | 3/1992 | Hornbeck | |
| 5,124,834 A | 6/1992 | Cusano et al. | |
| 5,142,405 A | 8/1992 | Hornbeck | |
| 5,142,414 A | 8/1992 | Koehler | |
| 5,153,771 A | 10/1992 | Link et al. | |
| 5,162,787 A | 11/1992 | Thompson et al. | |
| 5,168,406 A | 12/1992 | Nelson | |
| 5,170,156 A | 12/1992 | DeMond et al. | |
| 5,172,262 A | 12/1992 | Hornbeck | |
| 5,179,274 A | 1/1993 | Sampsell | |
| 5,192,395 A | 3/1993 | Boysel et al. | |
| 5,192,946 A | 3/1993 | Thompson et al. | |
| 5,206,629 A | 4/1993 | DeMond et al. | |
| 5,212,582 A | 5/1993 | Nelson | |
| 5,214,419 A | 5/1993 | DeMond et al. | |
| 5,214,420 A | 5/1993 | Thompson et al. | |
| 5,216,537 A | 6/1993 | Hornbeck | |
| 5,226,099 A | 7/1993 | Mignardi et al. | |
| 5,231,532 A | 7/1993 | Magel et al. | |
| 5,233,385 A | 8/1993 | Sampsell | |
| 5,233,456 A | 8/1993 | Nelson | |
| 5,233,459 A | 8/1993 | Bozler et al. | |
| 5,244,707 A | 9/1993 | Shores | |
| 5,254,980 A | 10/1993 | Hendrix et al. | |
| 5,272,473 A | 12/1993 | Thompson et al. | |
| 5,278,652 A | 1/1994 | Urbanus et al. | |
| 5,280,277 A | 1/1994 | Hornbeck | |
| 5,287,096 A | 2/1994 | Thompson et al. | |
| 5,293,511 A | 3/1994 | Poradish et al. | |
| 5,296,950 A | 3/1994 | Lin et al. | |
| 5,304,419 A | 4/1994 | Shores | |
| 5,305,640 A | 4/1994 | Boysel et al. | |
| 5,311,360 A | 5/1994 | Bloom et al. | |
| 5,312,513 A | 5/1994 | Florence et al. | |
| 5,323,002 A | 6/1994 | Sampsell et al. | |
| 5,325,116 A | 6/1994 | Sampsell | |
| 5,327,286 A | 7/1994 | Sampsell et al. | |
| 5,331,454 A | 7/1994 | Hornbeck | |
| 5,339,116 A | 8/1994 | Urbanus et al. | |
| 5,365,283 A | 11/1994 | Doherty et al. | |
| 5,381,253 A | 1/1995 | Sharp et al. | |
| 5,401,983 A | 3/1995 | Jokerst et al. | |
| 5,411,769 A | 5/1995 | Hornbeck | |
| 5,444,566 A | 8/1995 | Gale et al. | |
| 5,446,479 A | 8/1995 | Thompson et al. | |
| 5,448,314 A | 9/1995 | Heimbuch et al. | |
| 5,452,024 A | 9/1995 | Sampsell | |
| 5,454,906 A | 10/1995 | Baker et al. | |
| 5,457,493 A | 10/1995 | Leddy et al. | |
| 5,457,566 A | 10/1995 | Sampsell et al. | |
| 5,459,602 A | 10/1995 | Sampsell | |
| 5,459,610 A | 10/1995 | Bloom et al. | |
| 5,461,411 A | 10/1995 | Florence et al. | |
| 5,489,952 A | 2/1996 | Gove et al. | |
| 5,497,172 A | 3/1996 | Doherty et al. | |
| 5,497,197 A | 3/1996 | Gove et al. | |
| 5,499,062 A | 3/1996 | Urbanus | |
| 5,500,635 A | 3/1996 | Mott | |
| 5,500,761 A | 3/1996 | Goossen et al. | |
| 5,506,597 A | 4/1996 | Thompson et al. | |
| 5,515,076 A | 5/1996 | Thompson et al. | |
| 5,517,347 A | 5/1996 | Sampsell | |
| 5,523,803 A | 6/1996 | Urbanus et al. | |
| 5,526,051 A | 6/1996 | Gove et al. | |
| 5,526,172 A | 6/1996 | Kanack | |
| 5,526,688 A | 6/1996 | Boysel et al. | |
| 5,535,047 A | 7/1996 | Hornbeck | |
| 5,547,823 A | 8/1996 | Murasawa et al. | |
| 5,548,301 A | 8/1996 | Kornher et al. | |
| 5,550,373 A | 8/1996 | Cole et al. | |
| 5,551,293 A | 9/1996 | Boysel et al. | |
| 5,552,924 A | 9/1996 | Tregilgas | |
| 5,553,440 A | 9/1996 | Bulger et al. | |
| 5,559,358 A | 9/1996 | Burns et al. | |
| 5,563,398 A | 10/1996 | Sampsell | |
| 5,567,334 A | 10/1996 | Baker et al. | |
| 5,570,135 A | 10/1996 | Gove et al. | |
| 5,579,149 A | 11/1996 | Moret et al. | |
| 5,581,272 A | 12/1996 | Conner et al. | |
| 5,583,688 A | 12/1996 | Hornbeck | |
| 5,589,852 A | 12/1996 | Thompson et al. | |
| 5,591,379 A | 1/1997 | Shores | |
| 5,597,736 A | 1/1997 | Sampsell | |
| 5,600,383 A | 2/1997 | Hornbeck | |
| 5,602,671 A | 2/1997 | Hornbeck | |
| 5,606,441 A | 2/1997 | Florence et al. | |
| 5,608,468 A | 3/1997 | Gove et al. | |
| 5,610,438 A | 3/1997 | Wallace et al. | |
| 5,610,624 A | 3/1997 | Bhuva | |
| 5,610,625 A | 3/1997 | Sampsell | |
| 5,619,059 A | 4/1997 | Li et al. | |
| 5,619,365 A | 4/1997 | Rhoads et al. | |
| 5,619,366 A | 4/1997 | Rhoads et al. | |
| 5,636,052 A | 6/1997 | Arney et al. | |
| 5,641,713 A * | 6/1997 | Kyle | 156/330 |
| 5,646,729 A | 7/1997 | Koskinen et al. | |
| 5,646,768 A | 7/1997 | Kaeriyama | |
| 5,650,881 A | 7/1997 | Hornbeck | |
| 5,654,741 A | 8/1997 | Sampsell et al. | |
| 5,657,099 A | 8/1997 | Doherty et al. | |
| 5,659,374 A | 8/1997 | Gale, Jr. et al. | |
| 5,665,997 A | 9/1997 | Weaver et al. | |
| 5,703,710 A | 12/1997 | Brinkman et al. | |
| 5,710,656 A | 1/1998 | Goossen | |

(56) References Cited

U.S. PATENT DOCUMENTS

| | | |
|---|---|---|
| 5,739,945 A | 4/1998 | Tayebati |
| 5,745,193 A | 4/1998 | Urbanus et al. |
| 5,745,281 A | 4/1998 | Yi et al. |
| 5,771,116 A | 6/1998 | Miller et al. |
| 5,784,190 A | 7/1998 | Worley |
| 5,784,212 A | 7/1998 | Hornbeck |
| 5,815,141 A | 9/1998 | Phares |
| 5,818,095 A | 10/1998 | Sampsell |
| 5,825,528 A | 10/1998 | Goossen |
| 5,835,255 A | 11/1998 | Miles |
| 5,842,088 A | 11/1998 | Thompson |
| 5,843,140 A * | 12/1998 | Strojnik .................. 607/36 |
| 5,853,662 A | 12/1998 | Watanabe |
| 5,912,758 A | 6/1999 | Knipe et al. |
| 5,939,785 A | 8/1999 | Klonis et al. |
| 5,986,796 A | 11/1999 | Miles |
| 6,028,690 A | 2/2000 | Carter et al. |
| 6,038,056 A | 3/2000 | Florence et al. |
| 6,040,937 A | 3/2000 | Miles |
| 6,049,317 A | 4/2000 | Thompson et al. |
| 6,055,090 A | 4/2000 | Miles |
| 6,061,075 A | 5/2000 | Nelson et al. |
| 6,099,132 A | 8/2000 | Kaeriyama |
| 6,113,239 A | 9/2000 | Sampsell et al. |
| 6,129,603 A * | 10/2000 | Sun et al. .................. 445/25 |
| 6,147,790 A | 11/2000 | Meier et al. |
| 6,160,833 A | 12/2000 | Floyd et al. |
| 6,180,428 B1 | 1/2001 | Peeters et al. |
| 6,201,633 B1 | 3/2001 | Peeters et al. |
| 6,232,936 B1 | 5/2001 | Gove et al. |
| 6,238,755 B1 | 5/2001 | Harvey et al. |
| 6,282,010 B1 | 8/2001 | Sulzbach et al. |
| 6,295,154 B1 | 9/2001 | Laor et al. |
| 6,323,982 B1 | 11/2001 | Hornbeck |
| 6,355,328 B1 | 3/2002 | Baratuci et al. |
| 6,447,126 B1 | 9/2002 | Hornbeck |
| 6,455,927 B1 | 9/2002 | Glenn et al. |
| 6,465,355 B1 | 10/2002 | Horsley |
| 6,466,358 B2 | 10/2002 | Tew |
| 6,467,139 B1 | 10/2002 | Tanaka |
| 6,473,274 B1 | 10/2002 | Maimone et al. |
| 6,480,177 B2 | 11/2002 | Doherty et al. |
| 6,489,670 B1 | 12/2002 | Peterson et al. |
| 6,495,895 B1 | 12/2002 | Peterson et al. |
| 6,496,122 B2 | 12/2002 | Sampsell |
| 6,538,312 B1 | 3/2003 | Peterson et al. |
| 6,545,335 B1 | 4/2003 | Chua et al. |
| 6,548,908 B2 | 4/2003 | Chua et al. |
| 6,549,338 B1 | 4/2003 | Wolverton et al. |
| 6,552,840 B2 | 4/2003 | Knipe |
| 6,574,033 B1 | 6/2003 | Chui et al. |
| 6,582,789 B1 | 6/2003 | Sumi |
| 6,589,625 B1 | 7/2003 | Kothari et al. |
| 6,600,201 B2 | 7/2003 | Hartwell et al. |
| 6,603,182 B1 | 8/2003 | Low et al. |
| 6,606,175 B1 | 8/2003 | Sampsell et al. |
| 6,621,134 B1 | 9/2003 | Zurn |
| 6,625,047 B2 | 9/2003 | Coleman, Jr. |
| 6,627,814 B1 | 9/2003 | Stark |
| 6,630,786 B2 | 10/2003 | Cummings et al. |
| 6,632,698 B2 | 10/2003 | Ives |
| 6,643,069 B2 | 11/2003 | Dewald |
| 6,646,709 B2 | 11/2003 | Matsumoto |
| 6,650,455 B2 | 11/2003 | Miles |
| 6,661,084 B1 | 12/2003 | Peterson et al. |
| 6,666,561 B1 | 12/2003 | Blakley |
| 6,674,159 B1 | 1/2004 | Peterson et al. |
| 6,674,562 B1 | 1/2004 | Miles et al. |
| 6,680,792 B2 | 1/2004 | Miles |
| 6,709,750 B1 | 3/2004 | Pohlmann et al. |
| 6,710,908 B2 | 3/2004 | Miles et al. |
| 6,741,377 B2 | 5/2004 | Miles |
| 6,741,384 B1 | 5/2004 | Martin et al. |
| 6,741,503 B1 | 5/2004 | Farris et al. |
| 6,743,656 B2 | 6/2004 | Orcutt et al. |
| 6,747,785 B2 | 6/2004 | Chen et al. |
| 6,775,174 B2 | 8/2004 | Huffman et al. |
| 6,778,155 B2 | 8/2004 | Doherty et al. |
| 6,791,660 B1 | 9/2004 | Hayashi et al. |
| 6,794,119 B2 | 9/2004 | Miles |
| 6,811,267 B1 | 11/2004 | Allen et al. |
| 6,819,469 B1 | 11/2004 | Koba |
| 6,822,628 B2 | 11/2004 | Dunphy et al. |
| 6,829,132 B2 | 12/2004 | Martin et al. |
| 6,838,309 B1 | 1/2005 | McCann |
| 6,853,129 B1 | 2/2005 | Cummings et al. |
| 6,855,610 B2 | 2/2005 | Tung et al. |
| 6,859,218 B1 | 2/2005 | Luman et al. |
| 6,861,277 B1 | 3/2005 | Monroe et al. |
| 6,862,022 B2 | 3/2005 | Slupe |
| 6,862,029 B1 | 3/2005 | D'souza et al. |
| 6,867,896 B2 | 3/2005 | Miles |
| 6,870,581 B2 | 3/2005 | Li et al. |
| 6,872,984 B1 | 3/2005 | Leung |
| 6,912,078 B2 * | 6/2005 | Kudrle et al. .............. 359/224.1 |
| 6,999,225 B2 | 2/2006 | Lin et al. |
| 7,012,726 B1 | 3/2006 | Miles |
| 7,012,732 B2 | 3/2006 | Miles |
| 7,015,885 B2 | 3/2006 | Novotny et al. |
| 7,034,984 B2 | 4/2006 | Pan et al. |
| 7,042,643 B2 | 5/2006 | Miles |
| 7,060,895 B2 | 6/2006 | Kothari et al. |
| 7,119,945 B2 | 10/2006 | Kothari et al. |
| 7,122,937 B2 | 10/2006 | Hatakeyama et al. |
| 7,123,216 B1 | 10/2006 | Miles |
| 7,126,741 B2 | 10/2006 | Wagner et al. |
| 7,138,984 B1 | 11/2006 | Miles |
| 7,164,520 B2 | 1/2007 | Palmateer et al. |
| 7,307,776 B2 | 12/2007 | Miles et al. |
| 7,317,281 B2 | 1/2008 | Hayashi et al. |
| 7,327,510 B2 | 2/2008 | Cummings et al. |
| 7,381,583 B1 * | 6/2008 | Ebel et al. .................. 438/53 |
| 7,385,748 B2 | 6/2008 | Miles |
| RE40,436 E | 7/2008 | Kothari et al. |
| 7,471,444 B2 | 12/2008 | Miles |
| 7,532,385 B2 | 5/2009 | Lin |
| 8,287,995 B2 * | 10/2012 | Shibuya et al. .............. 428/213 |
| 8,379,392 B2 * | 2/2013 | Bita et al. .................. 361/735 |
| 2001/0003487 A1 | 6/2001 | Miles |
| 2002/0000649 A1 | 1/2002 | Tilmans et al. |
| 2002/0056898 A1 | 5/2002 | Lopes et al. |
| 2002/0056900 A1 | 5/2002 | Liu et al. |
| 2002/0075551 A1 | 6/2002 | Daneman |
| 2002/0075555 A1 | 6/2002 | Miles |
| 2002/0121909 A1 | 9/2002 | Sato et al. |
| 2002/0126364 A1 | 9/2002 | Miles |
| 2002/0146200 A1 * | 10/2002 | Kudrle et al. ................ 385/18 |
| 2002/0160583 A1 | 10/2002 | Song |
| 2002/0187254 A1 | 12/2002 | Ghosh |
| 2003/0010808 A1 * | 1/2003 | Uhland et al. .............. 228/110.1 |
| 2003/0043157 A1 | 3/2003 | Miles |
| 2003/0053233 A1 | 3/2003 | Felton |
| 2003/0054588 A1 | 3/2003 | Patel et al. |
| 2003/0062186 A1 | 4/2003 | Boroson et al. |
| 2003/0072070 A1 | 4/2003 | Miles |
| 2003/0075794 A1 | 4/2003 | Felton et al. |
| 2003/0103185 A1 | 6/2003 | Kim et al. |
| 2003/0104651 A1 | 6/2003 | Kim et al. |
| 2003/0108306 A1 | 6/2003 | Whitney et al. |
| 2003/0143423 A1 | 7/2003 | McCormick et al. |
| 2003/0155643 A1 | 8/2003 | Freidhoff |
| 2003/0170966 A1 * | 9/2003 | Lutz .......................... 438/456 |
| 2003/0183916 A1 | 10/2003 | Heck et al. |
| 2003/0184412 A1 | 10/2003 | Gorrell |
| 2003/0202264 A1 | 10/2003 | Weber et al. |
| 2003/0202265 A1 | 10/2003 | Reboa et al. |
| 2003/0202266 A1 | 10/2003 | Ring et al. |
| 2003/0214007 A1 | 11/2003 | Tao et al. |
| 2004/0048037 A1 | 3/2004 | Klausmann et al. |
| 2004/0051929 A1 | 3/2004 | Sampsell et al. |
| 2004/0058532 A1 | 3/2004 | Miles et al. |
| 2004/0061207 A1 * | 4/2004 | Ding .......................... 257/678 |
| 2004/0061492 A1 | 4/2004 | Lopes et al. |
| 2004/0066258 A1 | 4/2004 | Cohn et al. |

(56) References Cited

U.S. PATENT DOCUMENTS

| | | | |
|---|---|---|---|
| 2004/0070706 A1 | 4/2004 | Freeman | |
| 2004/0082145 A1* | 4/2004 | Reichenbach et al. | 438/455 |
| 2004/0100677 A1 | 5/2004 | Huibers et al. | |
| 2004/0108588 A1* | 6/2004 | Gilleo | 257/704 |
| 2004/0140557 A1 | 7/2004 | Sun et al. | |
| 2004/0145049 A1 | 7/2004 | McKinnell et al. | |
| 2004/0147056 A1 | 7/2004 | McKinnell et al. | |
| 2004/0160143 A1 | 8/2004 | Shreeve et al. | |
| 2004/0174583 A1 | 9/2004 | Chen et al. | |
| 2004/0179281 A1 | 9/2004 | Reboa | |
| 2004/0184133 A1 | 9/2004 | Su et al. | |
| 2004/0212026 A1 | 10/2004 | Van Brocklin et al. | |
| 2004/0217378 A1 | 11/2004 | Martin et al. | |
| 2004/0217919 A1 | 11/2004 | Piehl et al. | |
| 2004/0218251 A1 | 11/2004 | Piehl et al. | |
| 2004/0218334 A1 | 11/2004 | Martin et al. | |
| 2004/0227493 A1 | 11/2004 | Van Brocklin et al. | |
| 2004/0232535 A1* | 11/2004 | Tarn | 257/680 |
| 2004/0240032 A1 | 12/2004 | Miles | |
| 2004/0240138 A1 | 12/2004 | Martin et al. | |
| 2004/0245588 A1 | 12/2004 | Nikkel et al. | |
| 2004/0263944 A1 | 12/2004 | Miles et al. | |
| 2005/0001545 A1* | 1/2005 | Aitken et al. | 313/512 |
| 2005/0001828 A1 | 1/2005 | Martin et al. | |
| 2005/0012197 A1* | 1/2005 | Smith et al. | 257/687 |
| 2005/0023976 A1 | 2/2005 | Wang | |
| 2005/0036090 A1* | 2/2005 | Hayashi et al. | 349/122 |
| 2005/0036192 A1 | 2/2005 | Lin et al. | |
| 2005/0038950 A1 | 2/2005 | Adelmann | |
| 2005/0046919 A1 | 3/2005 | Taguchi et al. | |
| 2005/0046922 A1 | 3/2005 | Lin et al. | |
| 2005/0057442 A1 | 3/2005 | Way | |
| 2005/0068583 A1 | 3/2005 | Gutkowski et al. | |
| 2005/0069209 A1 | 3/2005 | Damera-Venkata et al. | |
| 2005/0074919 A1 | 4/2005 | Patel et al. | |
| 2005/0077584 A1* | 4/2005 | Uhland et al. | 257/414 |
| 2005/0093134 A1 | 5/2005 | Tarn | |
| 2005/0157376 A1 | 7/2005 | Huibers et al. | |
| 2005/0167795 A1 | 8/2005 | Higashi | |
| 2005/0174048 A1 | 8/2005 | Matsukaze | |
| 2005/0253283 A1 | 11/2005 | Dcamp et al. | |
| 2005/0254155 A1 | 11/2005 | Kunii et al. | |
| 2005/0258516 A1 | 11/2005 | Hong et al. | |
| 2006/0076634 A1 | 4/2006 | Palmateer et al. | |
| 2006/0152106 A1 | 7/2006 | Yan et al. | |
| 2006/0214247 A1 | 9/2006 | Dcamp et al. | |
| 2008/0003493 A1* | 1/2008 | Bates | 429/66 |
| 2010/0302618 A1 | 12/2010 | Patel et al. | |
| 2011/0290552 A1 | 12/2011 | Palmateer et al. | |

FOREIGN PATENT DOCUMENTS

| | | |
|---|---|---|
| EP | 1 418 154 | 5/2004 |
| EP | 1 457 804 | 9/2004 |
| FR | 2841380 | 12/2003 |
| JP | 59-6842 | 1/1984 |
| JP | 2068513 A | 3/1990 |
| JP | 3199920 A | 8/1991 |
| JP | 04-085859 | 3/1992 |
| JP | 11-145337 | 5/1999 |
| WO | WO 01/45140 | 6/2001 |
| WO | WO 02/42716 | 5/2002 |
| WO | WO 03/009318 | 1/2003 |
| WO | WO 03/026369 | 3/2003 |
| WO | WO 03/105198 | 12/2003 |
| WO | WO 2004/025727 | 3/2004 |
| WO | WO 2005/113376 | 12/2005 |

OTHER PUBLICATIONS

Substantive Examination Report dated Aug. 30, 2010 in Malaysian App. No. PI 20054174.

Jung et al., Soldered sealing process to assemble a protective cap for a MEMS CSP, Design, Test, Integration and Packaging of MEMS/MOEMS 2003 Symposium, pp. 255-260.

Kim et al., Fabrication and characteriziation of a low-temperature hermetic MEMS package bonded by a closed loop AuSn solder-line, Proceedings of the IEEE 16th Annual International Conference on Micro Electro Mechanical Systems, Jan. 2003, pp. 614-617.

Liang, Zhi-Hao et al., "A Low Temperature Wafer-Level Hermetic MEMS Package Using UV Curable Adhesive", Electronic Components and Technology Conference, 2004 IEEE, pp. 1486-1491.

Maharbiz et al., Batch micropackaging by compression-bonded wafer-wafer transfer, Twelfth IEEE International Conference on Micro Electro Mechanical Systems, Jan. 17-21, 1999, pp. 482-489.

Moraja, et al., Advanced Getter Solutions at Wafer Level to Assure High Reliability to the last Generations MEMS, IEEE Reliability Physics Symposium Proceedings, 2003, pp. 458-459.

Sparks, et al. Chip-Level Vacuum Packaging of Micromachines Using NanoGetters, IEEE Transactions on Advanced Packaging, vol. 26 Issue 3, Aug. 2003, pp. 277-282.

Tao et al., Selective Bonding and encapsulation for wafer-level vacuum packaging of mems and related micro systems, Microelectronics and Reliability, 44(2):251-258, Feb. 2004.

Tilmans et al., The indent reflow sealing (IRS) technique—A method for the fabrication of scaled cavities for mems devices, Journal of Microelectromechanical Systems, 9(2), Jun. 2000.

Tominetti, et al., Moisture and impurities detection and removal in packaged MEMS, Proceedings of the SPIE, Reliability, Testing and Characterization of MEMS/MOEMS, Oct. 2001, pp. 215-225.

Yang et al., Localized induction heating solder bonding for wafer level MEMS packaging, 17th IEEE International Conference on Micro Electro Mechanical Systems, Jan. 2004, pp. 729-732.

Extended European Search Report for App. No. 05255676.8 dated Nov. 6, 2007.

Notice of Reasons for Rejection dated Sep. 9, 2008 in Japanese App. No. 2005-264841.

Office Action dated Mar. 28, 2008 in Chinese App. No. 200510105032.9.

Office Action dated Oct. 24, 2008 in Chinese App. No. 200510105032.9.

Official Action received Jun. 3, 2009 in Russian App. No. 2005129946.

Office Action dated May 9, 2007 in U.S. Appl. No. 11/102,554.

Office Action dated Nov. 29, 2007 in U.S. Appl. No. 11/102,554.

Office Action dated Jun. 24, 2008 in U.S. Appl. No. 11/102,554.

Office Action dated Dec. 26, 2008 in U.S. Appl. No. 11/102,554.

Office Action dated Jul. 27, 2009 in U.S. Appl. No. 11/102,554.

Akasaka Y., "Three-Dimensional IC Trends," Proceedings of IEEE, 1986, vol. 74 (12), pp. 1703-1714.

Aratani K, et al., "Process and Design Considerations for Surface Micromachined Beams for a Tuneable Interferometer Array in Silicon," Proc. IEEE Microelectromechanical workshop fort Lauderdale FL, 1993, 230-235.

Aratani K. et al., "Surface Micromachined Tuneable Interferometer Array," Sensors and Actuators A, Elsevier Sequoia S.A., Lausanne, CH, A, 1993, 43(1/3), 17-23.

Conner, "Hybrid Color Display using Optical Interference Filter Array," SID Digest, 1993, 577-580.

Goossen, et al., "Silicon Modulator Based on Mechnically-Active Anti-Reflection Layer With 1Mbit/Sec Capability for Fiber-In-The-Loop Applications," IEEE Photonics Technology Letters, 1994, 1119-1121.

Goossen K.W. et al., "Possible Display Applications of the Silicon Mechanical Antireflection Switch," Society for Information Display, 1994.

Gosch, "West Germany Grabs the Lead in X-Ray Lithography," Electronics, 1987, 78-80.

Howard, et al., "Nanometer-Scale Fabrication Techniques," VLSI Electronics: Microstructure Science, 1982, vol. 5, 145-153, 166-173.

Jackson, "Classical Electrodynamics," John Wiley & Sons Inc, 1962, pp. 568-573.

Jerman et al., "A Miniature Fabry-Perot Interferometer with a Corrugated Silicon Diaphragm Support", IEEE Electron Devices Society, pp. 140-144, 1990.

Johnson, "Optical Scanners," Microwave Scanning Antennas, 1964, vol. 1(2), 251-261.

Light Over Matter Circle No. 36, Jun. 1993.

(56) References Cited

OTHER PUBLICATIONS

Miles M.W., "A New Reflective FPD Technology using Interferometric Modulation," Journal of the SID, 1997, vol. 5(4), 379-382.

Newsbreaks, "Quantum-trench devices might operated at terahertz frequencies", Laser Focus World, May 1993.

Oliner, "Radiating Elements and Mutual Coupling," Microwave Scanning Antennas, 1966, vol. 2, 131-157 and pp. 190-194.

Raley, et al:, "A Fabry-Perot Microinterferometer for Visible Wavelengths," IEEE Solid-State Sensor and Actuator Workshop, 1992, 170-173.

Sperger, et al., "High Performance Patterned All-Dielectric Interference Colour Filter for Display Applications," SID Digest, 1994, 81-83.

Stone J.M., "Radiation and Optics, An Introduction to the Classic Theory," 1963, McGraw-Hill, pp. 340-343.

Walker, et al., "Electron-Beam-Tunable Interference Filter Spatial Light Modulator," Optics Letters, 1988, vol. 13(5), 345-347.

Winton et al., "A novel way to capture solar energy," Chemical Week, pp. 17-18 (May 15, 1985).

Wu, et al., "Design of a Reflective Color LCD using Optical Interference Reflectors, "ASIA Display, Changchun Institute of Physics, 1995, 929-931.

\* cited by examiner

|  | Column Output Signals | |
|---|---|---|
|  | $+V_{bias}$ | $-V_{bias}$ |
| Row Output Signals  0 | Stable | Stable |
| $+\Delta V$ | Release | Actuate |
| $-\Delta V$ | Actuate | Release |

US 8,735,225 B2

METHOD AND SYSTEM FOR PACKAGING MEMS DEVICES WITH GLASS SEAL

CROSS-REFERENCE TO RELATED APPLICATIONS

This application is a continuation of U.S. patent application Ser. No. 11/102,554 entitled, "METHOD AND SYSTEM FOR PACKAGING MEMS DEVICES WITH INCORPORATED GETTER," and filed on Apr. 8, 2005, which claims priority to U.S. Provisional Patent Application No. 60/613,476 entitled, "METHOD AND DEVICE FOR PACKAGING INTERFEROMETRIC MODULATORS WITH HERMETIC BARRIER," and filed on Sep. 27, 2004. The disclosure of each of the above-described applications is hereby incorporated by reference in its entirety.

BACKGROUND

1. Field of the Invention

The field of the invention relates to microelectromechanical systems (MEMMS), and more particularly, to methods and systems for packaging MEMS devices.

2. Description of the Related Technology

Microelectromechanical systems (MEMS) include micromechanical elements, actuators, and electronics. Micromechanical elements may be created using deposition, etching, and or other micromachining processes that etch away parts of substrates and/or deposited material layers or that add layers to form electrical and electromechanical devices. One type of MEMS device is called an interferometric modulator. An interferometric modulator may comprise a pair of conductive plates, one or both of which may be transparent and/or reflective in whole or part and capable of relative motion upon application of an appropriate electrical signal. One plate may comprise a stationary layer deposited on a substrate, the other plate may comprise a metallic membrane separated from the stationary layer by an air gap. Such devices have a wide range of applications, and it would be beneficial in the art to utilize and/or modify the characteristics of these types of devices so that their features can be exploited in improving existing products and creating new products that have not yet been developed.

SUMMARY

The system, method, and devices of the invention each have several aspects, no single one of which is solely responsible for its desirable attributes. Without limiting the scope of this invention, its more prominent features will now be discussed briefly. After considering this discussion, and particularly after reading the section entitled "Detailed Description of Certain Embodiments" one will understand how the features of this invention provide advantages over other display devices.

One aspect of an electromechanical system device package includes a substrate, an electromechanical device formed on the substrate, a backplane, and a seal positioned proximate to a perimeter of the electromechanical device. In some embodiments the seal is in contact with the substrate and the backplane. In some embodiments the seal comprises glass.

In another aspect a method of sealing an electromechanical system device package includes forming a seal between a substrate and a backplane, wherein the substrate comprises an electromechanical device formed thereon and the seal is formed proximate to a perimeter of the electromechanical device, and wherein the seal comprises glass; and attaching the substrate, the seal, and the backplane, thereby encapsulating the electromechanical device.

In another aspect a system for sealing an electromechanical system device package includes a substrate, an electromechanical device formed on the substrate, a backplane and seal means positioned proximate to a perimeter of the electromechanical device. In some embodiments the seal means is in contact with the substrate and the backplane. In some embodiments the seal means includes glass.

DETAILED DESCRIPTION OF PREFERRED EMBODIMENTS

A plurality of embodiments of MEMS device package structures including improved sealant structures are described below. In one embodiment, the MEMS device is packaged between a backplate and a substrate which are held together by a primary seal. In one embodiment, the primary seal includes a chemically reactant getter. As is known in the art, a getter is a substance that captures or binds another substance by absorption, adsorption, or chemical reaction for example. A chemically reactant getter is a getter configured to chemically react with a gettered substance as opposed to absorbing or adsorbing a gettered substance. In other embodiments, the package structure includes a secondary seal disposed along an outer periphery of the primary seal. In one embodiment, the secondary seal includes a hydrophobic material, for example. In yet another embodiment, the package structure comprises a getter positioned proximate an inner periphery of the seal and is configured to getter water vapor or contaminants attempting to enter the interior of the package structure. In the described embodiments, no further getter or desiccant may be necessary to meet the desired lifetime attributes of the packaged device, thereby allowing for reduced package dimensions and cost.

The following detailed description is directed to certain specific embodiments of the invention. However, the invention can be embodied in a multitude of different ways. In this description, reference is made to the drawings wherein like parts are designated with like numerals throughout. As will be apparent from the following description, the invention may be implemented in any device that is configured to display an image, whether in motion (e.g., video) or stationary (e.g., still image), and whether textual or pictorial. More particularly, it is contemplated that the invention may be implemented in or associated with a variety of electronic devices such as, but not limited to, mobile telephones, wireless devices, personal data assistants (PDAs), hand-held or portable computers, GPS receivers/navigators, cameras, MP3 players, camcorders, game consoles, wrist watches, clocks, calculators, television monitors, flat panel displays, computer monitors, auto displays (e.g., odometer display, etc.), cockpit controls and/or displays, display of camera views (e.g., display of a rear view camera in a vehicle), electronic photographs, electronic billboards or signs, projectors, architectural structures, packaging, and aesthetic structures (e.g., display of images on a piece of jewelry). MEMS devices of similar structure to those described herein can also be used in non-display applications such as in electronic switching devices.

Figure 1:
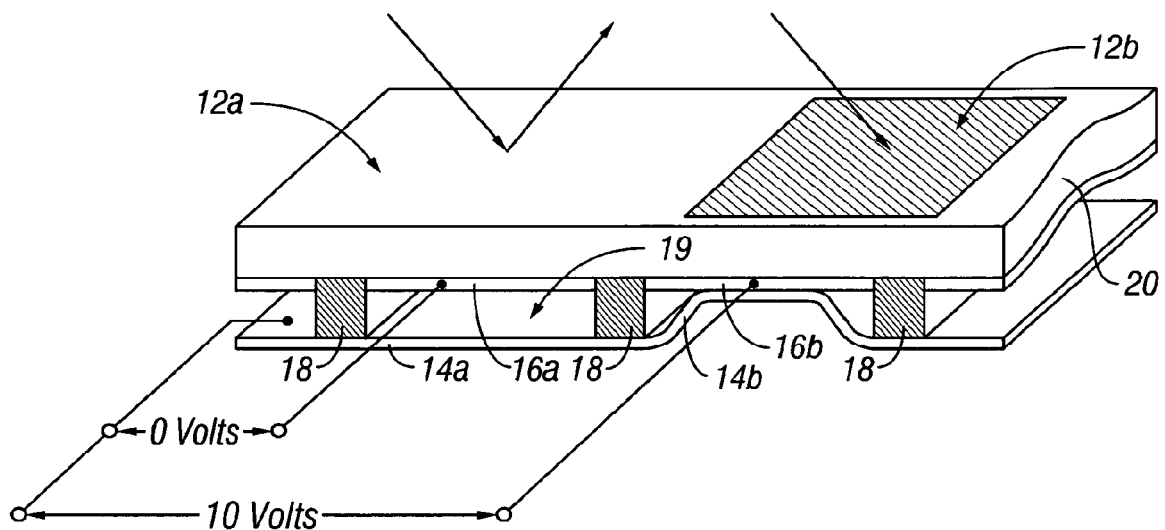
FIG. 1 is an isometric view depicting a portion of one embodiment of an interferometric modulator display in which a movable reflective layer of a first interferometric modulator is in a released position and a movable reflective layer of a second interferometric modulator is in an actuated position.

One interferometric modulator display embodiment comprising an interferometric MEMS display element is illustrated in FIG. 1. In these devices, the pixels are in either a bright or dark state. In the bright ("on" or "open") state, the display element reflects a large portion of incident visible light to a user. When in the dark ("off" or "closed") state, the display element reflects little incident visible light to the user. Depending on the embodiment, the light reflectance properties of the "on" and "off" states may be reversed. MEMS pixels can be configured to reflect predominantly at selected colors, allowing for a color display in addition to black and white.

FIG. 1 is an isometric view depicting two adjacent pixels in a series of pixels of a visual display, wherein each pixel comprises a MEMS interferometric modulator. In some embodiments, an interferometric modulator display comprises a row/column array of these interferometric modulators. Each interferometric modulator includes a pair of reflective layers positioned at a variable and controllable distance from each other to form a resonant optical cavity with at least one variable dimension. In one embodiment, one of the reflective layers may be moved between two positions. In the first position, referred to herein as the released state, the movable layer is positioned at a relatively large distance from a fixed partially reflective layer. In the second position, the movable layer is positioned more closely adjacent to the partially reflective layer. Incident light that reflects from the two layers interferes constructively or destructively depending on the position of the movable reflective layer, producing either an overall reflective or non-reflective state for each pixel.

The depicted portion of the pixel array in FIG. 1 includes two adjacent interferometric modulators 12a and 12b. In the interferometric modulator 12a on the left, a movable and highly reflective layer 14a is illustrated in a released position at a predetermined distance from a fixed partially reflective layer 16a. In the interferometric modulator 12b on the right, the movable highly reflective layer 14b is illustrated in an actuated position adjacent to the fixed partially reflective layer 16b.

The fixed layers 16a, 16b are electrically conductive, partially transparent and partially reflective, and may be fabricated, for example, by depositing one or more layers each of chromium and indium-tin-oxide onto a transparent substrate 20. The layers are patterned into parallel strips, and may form row electrodes in a display device as described further below. The movable layers 14a, 14b may be formed as a series of parallel strips of a deposited metal layer or layers (orthogonal to the row electrodes 16a, 16b) deposited on top of posts 18 and an intervening sacrificial material deposited between the posts 18. When the sacrificial material is etched away, the deformable metal layers are separated from the fixed metal layers by a defined air gap 19. A highly conductive and reflective material such as aluminum may be used for the deformable layers, and these strips may form column electrodes in a display device.

With no applied voltage, the cavity 19 remains between the layers 14a, 16a and the deformable layer is in a mechanically relaxed state as illustrated by the pixel 12a in FIG. 1. However, when a potential difference is applied to a selected row and column, the capacitor formed at the intersection of the row and column electrodes at the corresponding pixel becomes charged, and electrostatic forces pull the electrodes together. If the voltage is high enough, the movable layer is deformed and is forced against the fixed layer (a dielectric material which is not illustrated in this Figure may be deposited on the fixed layer to prevent shorting and control the separation distance) as illustrated by the pixel 12b on the right in FIG. 1. The behavior is the same regardless of the polarity of the applied potential difference. In this way, row/column actuation that can control the reflective vs. non-reflective pixel states is analogous in many ways to that used in conventional LCD and other display technologies.

Figure 2:
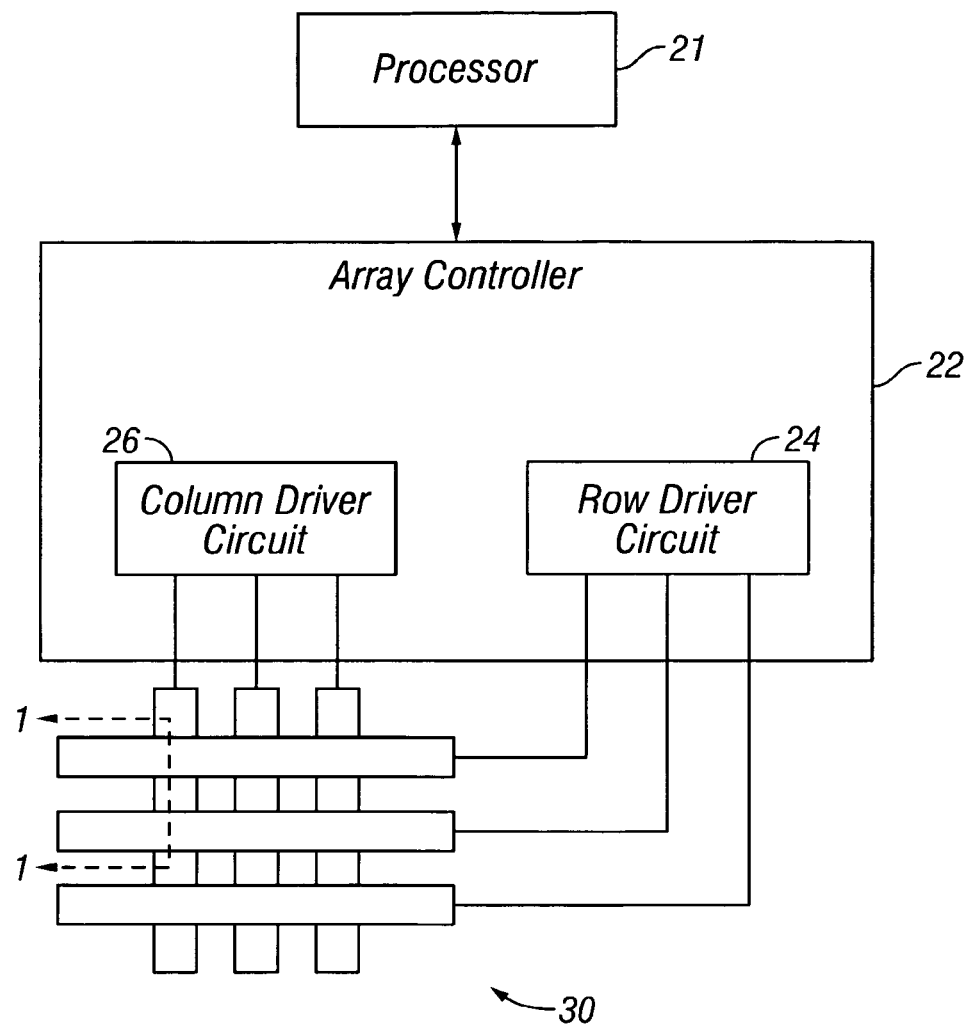
FIG. 2 is a system block diagram illustrating one embodiment of an electronic device incorporating a 3×3 interferometric modulator display.

FIGS. 2 through 5 illustrate one exemplary process and system for using an array of interferometric modulators in a display application. FIG. 2 is a system block diagram illustrating one embodiment of an electronic device that may incorporate aspects of the invention. In the exemplary embodiment, the electronic device includes a processor 21 which may be any general purpose single- or multi-chip microprocessor such as an ARM, Pentium®, Pentium II®, Pentium III®, Pentium IV®, Pentium® Pro, an 8051, a MIPS®, a Power PC®, an ALPHA®, or any special purpose microprocessor such as a digital signal processor, microcontroller, or a programmable gate array. As is conventional in the art, the processor 21 may be configured to execute one or more software modules. In addition to executing an operating system, the processor may be configured to execute one or more software applications, including a web browser, a telephone application, an email program, or any other software application.

In one embodiment, the processor 21 is also configured to communicate with an array controller 22. In one embodiment, the array controller 22 includes a row driver circuit 24 and a column driver circuit 26 that provide signals to a pixel array 30. The cross section of the array illustrated in FIG. 1 is shown by the lines 1-1 in FIG. 2. For MEMS interferometric modulators, the row/column actuation protocol may take advantage of a hysteresis property of these devices illustrated in FIG. 3. It may require, for example, a 10 volt potential difference to cause a movable layer to deform from the released state to the actuated state. However, when the voltage is reduced from that value, the movable layer maintains its state as the voltage drops back below 10 volts. In the exemplary embodiment of FIG. 3, the movable layer does not release completely until the voltage drops below 2 volts. There is thus a range of voltage, about 3 to 7 V in the example illustrated in FIG. 3, where there exists a window of applied voltage within which the device is stable in either the released or actuated state. This is referred to herein as the "hysteresis window" or "stability window." For a display array having the hysteresis characteristics of FIG. 3, the row/column actuation protocol can be designed such that during row strobing, pixels in the strobed row that are to be actuated are exposed to a voltage difference of about 10 volts, and pixels that are to be released are exposed to a voltage difference of close to zero volts. After the strobe, the pixels are exposed to a steady state voltage difference of about 5 volts such that they remain in whatever state the row strobe put them in. After being written, each pixel sees a potential difference within the "stability window" of 3-7 volts in this example. This feature makes the pixel design illustrated in FIG. 1 stable under the same applied voltage conditions in either an actuated or released pre-existing state. Since each pixel of the interferometric modulator, whether in the actuated or released state, is essentially a capacitor formed by the fixed and moving reflective layers, this stable state can be held at a voltage within the hysteresis window with almost no power dissipation. Essentially no current flows into the pixel if the applied potential is fixed.

In typical applications, a display frame may be created by asserting the set of column electrodes in accordance with the desired set of actuated pixels in the first row. A row pulse is then applied to the row 1 electrode, actuating the pixels corresponding to the asserted column lines. The asserted set of column electrodes is then changed to correspond to the desired set of actuated pixels in the second row. A pulse is then applied to the row 2 electrode, actuating the appropriate pixels in row 2 in accordance with the asserted column electrodes. The row 1 pixels are unaffected by the row 2 pulse, and remain in the state they were set to during the row 1 pulse. This may be repeated for the entire series of rows in a sequential fashion to produce the frame. Generally, the frames are refreshed and/or updated with new display data by continually repeating this process at some desired number of frames per second. A wide variety of protocols for driving row and column electrodes of pixel arrays to produce display frames are also well known and may be used in conjunction with the present invention.

Figures 3, 4:
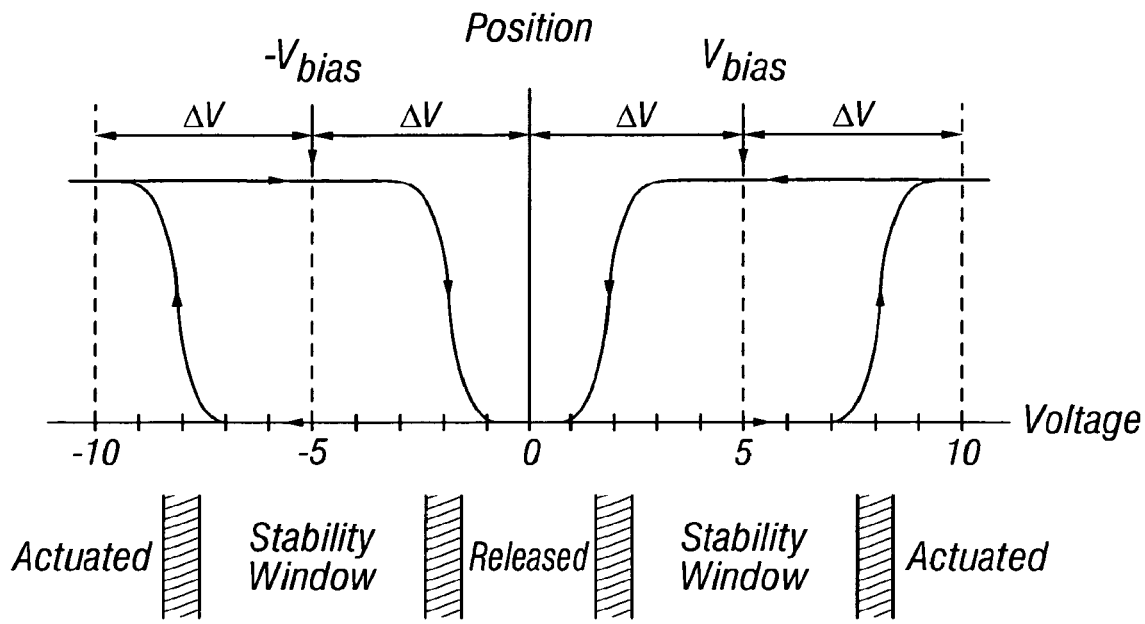
FIG. 3 is a diagram of movable mirror position versus applied voltage for one exemplary embodiment of an interferometric modulator of FIG. 1.
FIG. 4 is an illustration of a set of row and column voltages that may be used to drive an interferometric modulator display.

FIGS. 4 and 5 illustrate one possible actuation protocol for creating a display frame on the 3×3 array of FIG. 2. FIG. 4 illustrates a possible set of column and row voltage levels that may be used for pixels exhibiting the hysteresis curves of FIG. 3. In the FIG. 4 embodiment, actuating a pixel involves setting the appropriate column to $-V_{bias}$, and the appropriate row to $+\Delta V$, which may correspond to −5 volts and +5 volts respectively Releasing the pixel is accomplished by setting the appropriate column to $+V_{bias}$, and the appropriate row to the same $+\Delta V$, producing a zero volt potential difference across the pixel. In those rows where the row voltage is held at zero volts, the pixels are stable in whatever state they were originally in, regardless of whether the column is at $+V_{bias}$, or $-V_{bias}$. As is also illustrated in FIG. 4, it will be appreciated that voltages of opposite polarity than those described above can be used, e.g., actuating a pixel can involve setting the appropriate column to $+V_{bias}$, and the appropriate row to $-\Delta V$. In this embodiment, releasing the pixel is accomplished by setting the appropriate column to $-V_{bias}$, and the appropriate row to the same $-\Delta V$, producing a zero volt potential difference across the pixel.

Figure 5A:
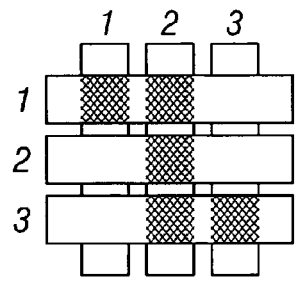
FIGS. 5A and 5B illustrate one exemplary timing diagram for row and column signals that may be used to write a frame of display data to the 3×3 interferometric modulator display of FIG. 2.
Figure 5B:
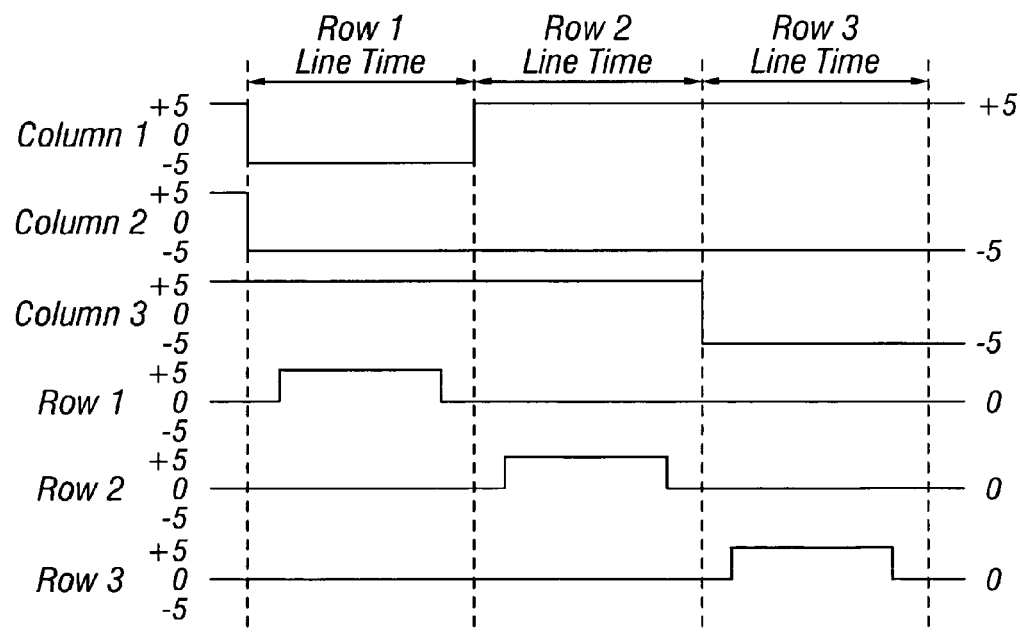

FIG. 5B is a timing diagram showing a series of row and column signals applied to the 3×3 array of FIG. 2 which will result in the display arrangement illustrated in FIG. 5A, where actuated pixels are non-reflective. Prior to writing the frame illustrated in FIG. 5A, the pixels can be in any state, and in this example, all the rows are at 0 volts, and all the columns are at +5 volts. With these applied voltages, all pixels are stable in their existing actuated or released states.

In the FIG. 5A frame, pixels (1,1), (1,2), (2,2), (3,2) and (3,3) are actuated. To accomplish this, during a "line time" for row 1, columns 1 and 2 are set to −5 volts, and column 3 is set to +5 volts. This does not change the state of any pixels, because all the pixels remain in the 3-7 volt stability window. Row 1 is then strobed with a pulse that goes from 0, up to 5 volts, and back to zero. This actuates the (1,1) and (1,2) pixels and releases the (1,3) pixel. No other pixels in the array are affected. To set row 2 as desired, column 2 is set to −5 volts, and columns 1 and 3 are set to +5 volts. The same strobe applied to row 2 will then actuate pixel (2,2) and release pixels (2,1) and (2,3). Again, no other pixels of the array are affected. Row 3 is similarly set by setting columns 2 and 3 to −5 volts, and column 1 to +5 volts. The row 3 strobe sets the row 3 pixels as shown in FIG. 5A. After writing the frame, the row potentials are zero, and the column potentials can remain at either +5 or −5 volts, and the display is then stable in the arrangement of FIG. 5A. It will be appreciated that the same procedure can be employed for arrays of dozens or hundreds of rows and columns. It will also be appreciated that the timing, sequence, and levels of voltages used to perform row and column actuation can be varied widely within the general principles outlined above, and the above example is exemplary only, and any actuation voltage method can be used with the present invention.

Figure 6A:
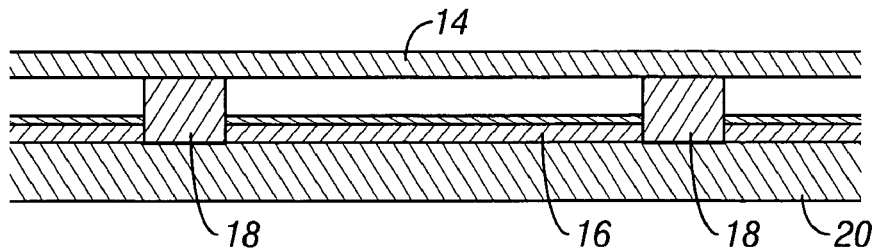
FIG. 6A is a cross-sectional view of the device of FIG. 1.
Figure 6B:
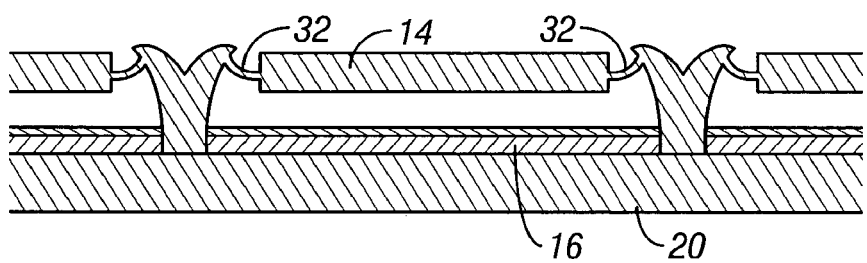
FIG. 6B is a cross-sectional view of an alternative embodiment of an interferometric modulator.
Figure 6C:
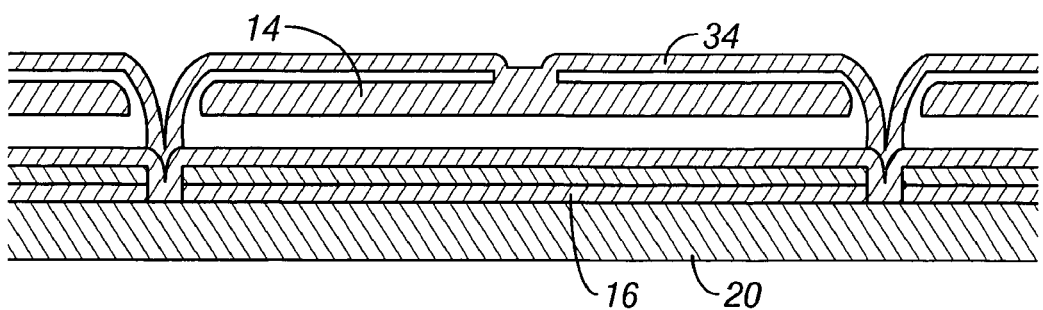
FIG. 6C is a cross-sectional view of another alternative embodiment of an interferometric modulator.

The details of the structure of interferometric modulators that operate in accordance with the principles set forth above may vary widely. For example, FIGS. 6A-6C illustrate three different embodiments of the moving mirror structure. FIG. 6A is a cross section of the embodiment of FIG. 1, where a strip of metal material 14 is deposited on orthogonally extending supports 18. In FIG. 6B, the moveable reflective material 14 is attached to supports at the corners only, on tethers 32. In FIG. 6C, the moveable reflective material 14 is suspended from a deformable layer 34. This embodiment has benefits because the structural design and materials used for the reflective material 14 can be optimized with respect to the optical properties, and the structural design and materials used for the deformable layer 34 can be optimized with respect to desired mechanical properties. The production of various types of interferometric devices is described in a variety of published documents, including, for example, U.S. Published Application 2004/0051929. A wide variety of well known techniques may be used to produce the above described structures involving a series of material deposition, patterning, and etching steps.

Figure 7:
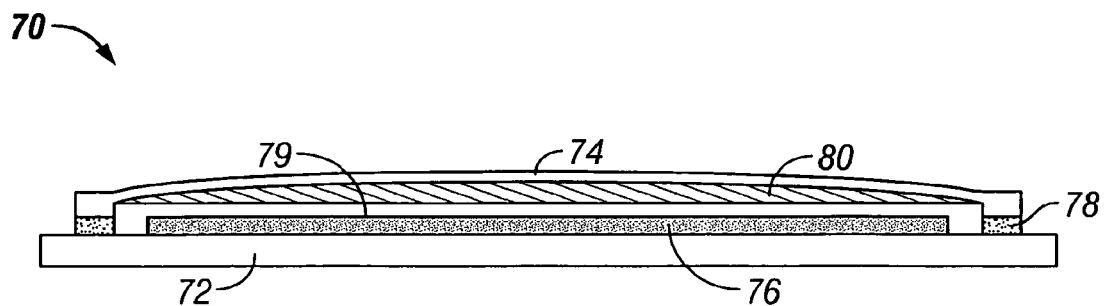
FIG. 7 is a cross-sectional view of a basic package structure for an interferometric modulator device.

The moving parts of a MEMS device, such as an interferometric modulator array, preferably have a protected space in which to move. Packaging techniques for a MEMS device will be described in more detail below. A schematic of a basic package structure for a MEMS device, such as an interferometric modulator array, is illustrated in FIG. 7. As shown in FIG. 7, a basic package structure 70 includes a substrate 72 and a backplane cover or "cap" 74, wherein an interferometric modulator array 76 is formed on the substrate 72. This cap 74 is also called a "backplane".

The substrate 72 and the backplane 74 are joined by a seal 78 to form the package structure 70, such that the interferometric modulator array 76 is encapsulated by the substrate 72, backplane 74, and the seal 78. This forms a cavity 79 between the backplane 74 and the substrate 72. The seal 78 may be a non-hermetic seal, such as a conventional epoxy-based adhesive. In other embodiments, the seal 78 may be a polyisobutylene (sometimes called butyl rubber, and other times PIB), o-rings, polyurethane, thin film metal weld, liquid spin-on glass, solder, polymers, or plastics, among other types of seals that may have a range of permeability of water vapor of about 0.2-4.7 g mm/m2 kPa day. In still other embodiments, the seal 78 may be a hermetic seal and may comprise, for example, metals, welds, and glass frits. Methods of hermetic sealing comprise, for example, metal or solder thin film or preforms, laser or resistive welding techniques, and anodic bonding techniques, wherein the resulting package structure may or may not require a desiccant to achieve the desired internal package requirements.

The seal 78 may be implemented as a closed seal or an open seal, and may be applied or formed on the substrate 72, backplane 74, or both the substrate and backplane 74 in a method of packaging the interferometric modulator array 76. The seal 78 may be applied through simple in-line manufacturing processes and may have advantages for lower temperature processes, whereas the techniques of welding and soldering may require very high temperature processes that can damage the package structure 20, are relatively expensive. In some cases, localized heating methods can be used to reduce the process temperatures and yield a viable process solution.

In some embodiments, the package structure 70 includes a getter such as a desiccant 80 configured to reduce moisture within the cavity 79. The skilled artisan will appreciate that a desiccant may not be necessary for a hermetically sealed package, but may be desirable to control moisture resident within the package. In one embodiment, the desiccant 80 is positioned between the interferometric modulator array 76 and the backplane 74. Desiccants may be used for packages that have either hermetic or non-hermetic seals. In packages having a hermetic seal, desiccants are typically used to control moisture resident within the interior of the package. In packages having a non-hermetic seal, a desiccant may be used to control moisture moving into the package from the environment. Generally, any substance that can trap moisture while not interfering with the optical properties of the interferometric modulator array may be used as the desiccant 80. Suitable getter and desiccant materials include, but are not limited to, zeolites, molecular sieves, surface adsorbents, bulk adsorbents, and chemical reactants.

The desiccant 80 may be in different forms, shapes, and sizes. In addition to being in solid form, the desiccant 80 may alternatively be in powder form. These powders may be inserted directly into the package or they may be mixed with an adhesive for application. In an alternative embodiment, the desiccant 80 may be formed into different shapes, such as cylinders, rings, or sheets, before being applied inside the package.

The skilled artisan will understand that the desiccant 80 can be applied in different ways. In one embodiment, the desiccant 80 is deposited as part of the interferometric modulator array 76. In another embodiment, the desiccant 80 is applied inside the package 70 as a spray or a dip coat.

The substrate 72 may be a semi-transparent or transparent substance capable of having thin film, MEMS devices built upon it. Such transparent substances include, but are not limited to, glass, plastic, and transparent polymers. The interferometric modulator array 76 may comprise membrane modulators or modulators of the separable type. The skilled artisan will appreciate that the backplane 74 may be formed of any suitable material, such as glass, metal, foil, polymer, plastic, ceramic, or semiconductor materials (e.g., silicon).

The packaging process may be accomplished in a vacuum, pressure between a vacuum up to and including ambient pressure, normal atmospheric pressure conditions, or pressure higher than ambient pressure. The packaging process may also be accomplished in an environment of varied and controlled high or low pressure during the sealing process. There may be advantages to packaging the interferometric modulator array 76 in a completely dry environment, but it is not necessary. Similarly, the packaging environment may be of an inert gas at ambient conditions. Packaging at ambient conditions allows for a lower cost process and more potential for versatility in equipment choice because the device may be transported through ambient conditions without affecting the operation of the device.

Generally, it is desirable to minimize the permeation of water vapor into the package structure 70, and thus control the environment in the cavity 79 of the package structure 70 and hermetically seal it to ensure that the environment remains constant. When the humidity or water vapor level within the package exceeds a level beyond which surface tension from the water vapor becomes higher than the restoration force of a movable element (not shown) in the interferometric modulator array 76, the movable element may become permanently adhered to the surface. There is thus a need to reduce the moisture level within the package.

In embodiments of the package structure 70 where the seal 78 includes an adhesive, the adhesive component alone may not act as a suitable environmental barrier because it eventually allows water vapor and/or contaminates to permeate into the cavity 79 of the package structure 70. Accordingly, certain embodiments of a package structure 70 include a getter inside the package structure 70 or incorporated into the seal 78. The getter may be configured to getter contaminant gases that are outgassed from the interferometric modulator array 76 or packaging components after the package structure 70 is assembled, such as substances outgassed or evaporated from an adhesive in the seal 78 into the cavity 79 while the adhesive is curing. The getter may be a chemically reactant getter configured to chemically react with specific substances, or the getter may be configured to physical transform in the presence of a specific substance, such as water. For example, the getter may comprise a desiccant such as zeolites, configured to physically transform in contact with water or water vapor. In other embodiments the getter is positioned inside the package structure 70 proximate an inner perimeter of the seal 78 so as to getter water vapor or contaminants inside the package structure 70 as they are released from components inside the cavity 79, or substances that have permeated through the seal 78. In yet another embodiment, the package structure 70 includes a secondary seal applied to the outside of the seal 78, wherein the secondary seal comprises a hydrophobic material configured to keep water vapor out of the package structure 70, or reduce the rate of permeation of water vapor into the package structure 70.

In one embodiment of a package structure 70, the seal 78 comprises a chemically reactant getter configured to getter substances attempting to permeate the seal 78 and enter the package structure 70, and/or substances within the package structure 78 that were present at the time of manufacture or assembly, or released during or subsequent to manufacture or assembly. The chemically reactant getter may include, for example, calcium oxide, strontium (Sr), strontium oxide, and aluminum complexes. In certain embodiments, the seal 78 comprises a mixture of the chemically reactant getter and an adhesive. In some embodiments, the seal 78 includes a sufficient amount of getter to getter or capture substantially all of the substances outgassed or released from the sealant components during manufacture or assembly, such as substances outgassed from an adhesive material while curing. The amount of getter included in the seal may be limited to such amount so as not to adversely effect the permeability of the seal, yet still capture the substances released from the sealant components during manufacture or assembly of the package structure 70.

Figure 8:
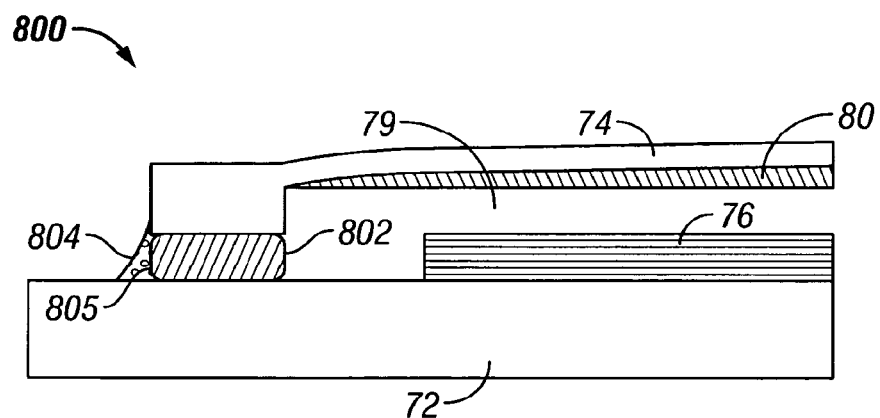
FIG. 8 is a cross-sectional view of a portion of one embodiment of an interferometric modulator package structure with a primary seal and a secondary seal.

Another embodiment of a package structure 800, as illustrated in cross-section in FIG. 8, includes a primary seal 802 positioned in contact with the substrate 72 and the backplane 74, and a secondary seal 804 positioned proximate an outer periphery 805 of the primary seal 802. The secondary seal 804 may be in contact with the primary seal 802 as illustrated in FIG. 8, or there may be a gap between the secondary seal 804 and the primary seal 802. In some embodiments, the secondary seal 804 is in contact with the primary seal 802, the substrate 76, and the backplane 74. The cross-sectional geometry of the secondary seal 804 may be dependent upon the material of the seal 804, and may further be dependent on the method of formation or application of the seal 804 and is not limited to that illustrated in FIG. 8.

In certain embodiments, the secondary seal 804 comprises a low permeation rate adhesive or a hydrophobic material, such as PTFE or related compounds. In some embodiments, the secondary seal 804 comprises polyisobutylene (sometimes called butyl rubber, and other times PIB), o-rings, polyurethane, thin film metal weld, liquid spin-on glass, solder, polymers, or plastics, or combinations thereof.

In other embodiments, the secondary seal 804 comprises a low-cost sealant material regardless of permeation attributes and is configured to act in concert with the primary seal 802 to reduce the permeation rate of water vapor or other contaminants into the cavity 79 of the package structure 800. Embodiments of a method of applying or forming the secondary seal 804 may comprise, for example, dispensing or printing a bead of sealant material, spray-on, placement of preform, printing, or other methods known to those skilled in the art.

In embodiments where the primary seal 802 comprises a getter such as a desiccant, the permeation rate of water vapor through the primary seal 802 may increase rapidly as the desiccant approaches or reaches its maximum capacity to absorb or react with water molecules. The secondary seal 804 advantageously reduces this water vapor permeation rate, thereby extending the life of the interferometric modulator array 76 within the package structure 800. Although the package structure 800 is illustrated in FIG. 8 as including the desiccant 80 on the backplane 74, embodiments of the package structure 800 may be manufactured or assembled without the desiccant 80, or wherein the desiccant is place in another position within the package structure.

Figure 9:
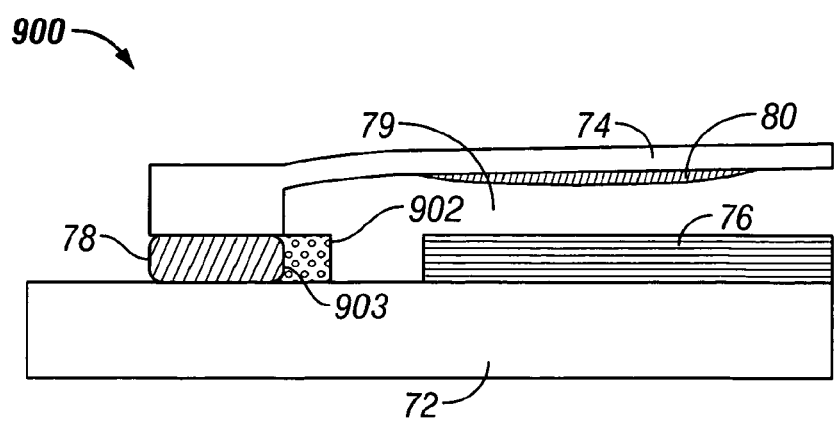
FIG. 9 is a cross-sectional view of a portion of one embodiment of an interferometric modulator package structure with a getter material positioned inside the package structure proximate the seal.

FIG. 9 is a cross-sectional view of one embodiment of a package structure 900 including a getter 902 positioned proximate an inner periphery 903 of the seal 78. The getter may comprise zeolites, molecular sieves, surface adsorbents, bulk adsorbents, and chemically reactant substances, or a combination thereof, for example. In one embodiment, the getter 902 comprises a mixture of a getter material and an adhesive. The getter 902 is preferably configured to getter substances such as water vapor and contaminants that have permeated the seal 78 from the environment, substances outgassed or released from the seal 78 during manufacture or assembly, and substances within the cavity 79 of the package structure 900. The getter 902 may be in contact with the seal 78 or there may be a gap between the getter 902 and the seal 78. For example, in embodiments wherein the getter 902 increases in size when saturated with an absorbed substance, there is preferably a gap between the getter 902 and the seal 78.

The getter 902 as illustrated in FIG. 9 has a substantially rectangular cross-section and is in contact with the substrate 72 and the seal 78. However, as will be appreciated by those skilled in the art, the cross-sectional geometry of the getter 902 may be different than that illustrated in FIG. 9 and may, in certain embodiments, depend upon the method of formation or application of the getter 902. In one embodiment, the getter 902 is formed using thin film technology. In addition, the getter 902 may be in contact with the backplane 74 in addition to the substrate 72 or instead of the substrate 72.

In embodiments of the package structure 900 wherein the seal 78 comprises a metal seal, for example, contaminant substances may be outgassed or released due to a chemical reaction during formation of the seal. For example, where the seal 78 comprises a solder, an oxide may be released during application or formation of the seal, or assembly of the package structure 900. Accordingly, the getter 902 is preferably configured to getter the substances outgassed or released from the seal during application or formation of the seal, or assembly of the package structure 900.

In certain embodiments, as illustrated in FIG. 9, the package structure 900 does not include the desiccant 80 which is included in other package structures, such as the package structure 70 of FIG. 7. However, the package structure 900 may include the desiccant 80 and is not limited to the configuration or components illustrated in FIG. 9.

In one embodiment, the getter may include calcium oxide, or aluminosilicate-structured minerals such as sodium aluminosilicate. In another embodiment, the getter may include microporous silicate-structured minerals. It will be appreciated that active components other than zeolites that can act as absorbing filters on the molecular level can also be implemented as the getter. The adhesives discussed above may include an adhesive with low outgassing numbers, or an adhesive with various outgassing numbers.

The skilled artisan will understand that the amount of material for the seal 78 or the amount of getter or hydrophobic material may depend on the estimated amount of moisture or contaminant gases that will need to be removed from the package structure during its desired operational lifetime. The amount of material for the seal 78, or amount of getter or hydrophobic material, either incorporated into the seal 78 or inside or outside the cavity 79 of the package structure 70 also depends not only on the amount of moisture or contaminant gases inside the package structure 20 when the package is formed, but also the permeation rate of the seal 78 and the outgassing potential of the package components.

In certain embodiments, the seal 78 is preferably formed to a thickness in a range of about 100-300 Å (using thin films, for example), about 10-30 μm, or about 50 μm. The skilled artisan will appreciate that the thickness of the seal 78 and the amount of getter incorporated into the seal 78 or the cavity 79 of the package structure 70, or the secondary seal proximate the outer periphery of the seal 78, will depend on various factors, such as the desired lifetime of the packaged device, the material components of the seal 78, the amount of contaminants and moisture that are estimated to permeate into the package structure 70 during the lifetime, the anticipated humidity level of the ambient environment for the package structure 70, and whether an additional getter or desiccant 80 is included within the package structure 70.

As discussed above, the package structures may or may not include the desiccant 80 described in connection with FIG. 7.

For example, where the seal 78 includes a getter, where a secondary seal is formed at the outer periphery of the seal 78, or where a getter is positioned proximate an inner periphery of the seal 78, no additional desiccant within the package structure may be necessary to meet the desired lifetime attributes of the packaged device. In embodiments where the package structure does not have to accommodate the desiccant 80, the package dimensions and cost can be reduced accordingly.

In some embodiments, the getter comprises zeolites. Zeolites may absorb water molecules at relatively high temperatures. Zeolites can trap moisture and contaminant gases in their pores. The skilled artisan will understand that zeolites having deferent pore sizes can be selected for the seal 78 material to absorb different contaminants. In some embodiments, the getter includes zeolites that are selected to absorb contaminant molecules, such as aromatic branched-chain hydrocarbons that have critical diameters of up to ten angstroms. In another embodiment, zeolites having pore sizes between two and three angstroms may be selected to abort contaminant molecules having diameters of less than two angstroms, such as hydrogen and moisture molecules. In still another embodiment, zeolites having pore sizes of fifty angstroms can be used to absorb nitrogen and carbon dioxide molecules. The skilled artisan will appreciate that the seal 78 and getters or hydrophobic materials used inside and outside the package structure may comprise a mixture of zeolites or other tailored or functionalized getter materials having various pore sizes.

The foregoing description details certain embodiments of the invention. It will be appreciated, however, that no matter how detailed the foregoing appears in text, the invention can be practiced in many ways. As is also stated above, it should be noted that the use of particular terminology when describing certain features or aspects of the invention should not be taken to imply that the terminology is being re-defined herein to be restricted to including any specific characteristics of the features or aspects of the invention with which that terminology is associated. The scope of the invention should therefore be construed in accordance with the appended claims and any equivalents thereof.

What is claimed is:

1. A method of sealing an electromechanical systems device package, comprising:
    positioning a substrate and a backplane in proximity to each other, the substrate supporting an electromechanical systems device formed thereon;
    laser welding the backplane to the substrate to form a seal proximate to a perimeter of the electromechanical systems device, the seal formed only of at least one of substrate material and backplane material fused via the laser welding, the substrate and the backplane encapsulating the electromechanical systems device in a package, wherein the seal is formed of at least one of spin-on glass and glass frit; and
    forming a secondary seal on the exterior of the package.

2. A system for sealing an electromechanical systems device package, comprising:
    a substrate;
    an electromechanical systems device formed on the substrate;
    a backplane;
    a seal positioned proximate to a perimeter of the electromechanical systems device, the seal formed only of at least one of fused substrate material and backplane material, the electromechanical systems device encapsulated between the substrate and the backplane in a package, and the seal is formed of at least one of spin-on glass and glass frit; and
    a secondary seal disposed on an exterior of the package.

3. The system of claim 2, wherein the electromechanical systems device is a microelectromechanical systems device.

4. The system of claim 3, wherein the microelectromechanical systems device is an interferometric modulator.

5. The system of claim 2, wherein the seal is a substantially hermetic seal.

6. The system of claim 2, wherein the seal is one of a closed seal or an open seal.

7. The system of claim 2 further comprising a desiccant in the package.

8. The system of claim 2 further comprising a getter in the package.

9. The system of claim 2, wherein a cavity exists between the electromechanical systems device and the backplane.

10. The system of claim 2 further comprising a processor electrically connected to the electromechanical systems device.

11. The method of claim 1, wherein the electromechanical systems device comprises a microelectromechanical systems device.

12. The method of claim 11, wherein the microelectromechanical systems device comprises an interferometric modulator.

13. The method of claim 11, wherein the microelectromechanical systems device comprises an array of interferometric modulators.

14. The method of claim 1, wherein the seal comprises a substantially hermetic seal.

15. The method of claim 1 further comprising providing a desiccant inside the package.

16. The method of claim 1 further comprising providing a getter inside the package.

17. The method of claim 1, wherein a cavity exists between the electromechanical systems device and the backplane.

18. The method of claim 1, wherein the method is performed in ambient pressure.

19. The method of claim 1, wherein the method is performed in a partial vacuum.

20. The method of claim 1, wherein the method is performed in pressure higher than ambient pressure.

21. The method of claim 1, wherein the method is performed in ambient temperature.

22. The method of claim 1, wherein the method is performed in a completely dry environment.

23. The method of claim 1, wherein the method is performed in an inert gas at ambient temperature and pressure.

24. The method of claim 1 further comprising electrically connecting the electromechanical systems device to a processor.

25. A system for sealing an electromechanical systems device package, comprising:
    a substrate including an electromechanical systems device formed thereon;
    a backplane including at least one of liquid spin-on glass and glass frit;
    a seal positioned proximate to a perimeter of the electromechanical systems device, the seal formed only of at least one of fused substrate material and backplane material, and wherein the electromechanical systems device encapsulated between the substrate and the backplane in a package; and
    a secondary seal disposed on an exterior surface of the package.

26. The system of claim 25, wherein the electromechanical systems device is an interferometric modulator.

27. The system of claim 25, wherein the seal is a substantially hermetic seal.

28. The system of claim 25 further comprising a desiccant in the package.

\* \* \* \* \*